(12) United States Patent
Yang et al.

(10) Patent No.: US 6,956,254 B2
(45) Date of Patent: Oct. 18, 2005

(54) MULTILAYERED DUAL BIT MEMORY DEVICE WITH IMPROVED WRITE/ERASE CHARACTERISTICS AND METHOD OF MANUFACTURING

(75) Inventors: Chin-Tien Yang, Hsin-Chu (TW); Mu-Yi Lin, Hsin-Chu (TW); Yu-Wei Tseng, Hsin-Chu (TW); Min Ca, Hsin-Chu (TW); Yu-Hua Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/725,234

(22) Filed: Dec. 1, 2003

(65) Prior Publication Data

US 2005/0116281 A1 Jun. 2, 2005

(51) Int. Cl.[7] .............................................. H01L 27/148
(52) U.S. Cl. ...................... 257/235; 257/324; 257/325; 257/390; 257/411; 257/391
(58) Field of Search ................................. 257/235, 324, 257/325, 390, 411, 391

(56) References Cited

U.S. PATENT DOCUMENTS

| | | | | |
|---|---|---|---|---|
| 6,538,292 B2 | * | 3/2003 | Chang et al. ................ | 257/391 |
| 6,583,007 B1 | * | 6/2003 | Eitan ........................... | 438/257 |
| 6,664,600 B2 | * | 12/2003 | Ahmad et al. .............. | 257/366 |
| 6,720,614 B2 | * | 4/2004 | Lin et al. .................... | 257/316 |
| 6,757,208 B1 | * | 6/2004 | Huang et al. .............. | 365/225.6 |
| 6,829,172 B2 | * | 12/2004 | Bloom et al. .......... | 365/185.22 |
| 6,833,580 B2 | * | 12/2004 | Huseh ......................... | 257/315 |

OTHER PUBLICATIONS

Hsu, John Y., "Flash Memory Design," [online] http://www.ewh.ieee.org/r6/central_coast/Hsu2001.html (Dec. 4, 2001) pp. 1–8.
Lammers, D., "AMD Pits MirrorBit Against Intel StrataFlash," [online] http://www.eetimes.com/story/OEG20020513S0012 (May 13, 2002) pp. 1–2.
Eitan, B., et al., "NROM: A Novel Localized Trapping, 2–Bit Nonvolatile Memory Cell," IEEE Electron Device Letters, vol. 21, No. 11 (Nov. 2000) pp. 543–545.
Lusky, E., et al., "Electrons Retention Model for Localized Charge in Oxide–Nitride–Oxide (ONO) Dielectric," IEEE Electron Device Letters, vol. 23, No. 9 (Sep. 2002) pp. 556–558.
"ETOX Flash Memory Technology: Scaling and Integration Challenges" Intel Technology Journal, vol. 6, Issue 2 (May 16, 2002) pp. 27–30.

* cited by examiner

Primary Examiner—Nathan J. Flynn
Assistant Examiner—Remmon R. Fordé
(74) Attorney, Agent, or Firm—Slater & Matsil, L.L.P.

(57) ABSTRACT

A dual bit ROM multilayered structure with improved write and erase functions and a method of manufacturing is disclosed. The structure includes a pair of floating gates at the middle or nitride layer to better define the two locations of electrons representing the dual data bits collected in the middle layer.

24 Claims, 4 Drawing Sheets

MULTILAYERED DUAL BIT MEMORY DEVICE WITH IMPROVED WRITE/ERASE CHARACTERISTICS AND METHOD OF MANUFACTURING

TECHNICAL FIELD

The present invention relates generally to a dual bit memory devices and more particularly to multilayered memory devices such as ONO (oxide-nitride-oxide) devices, combined with dual gate members to improve write and erase characteristics.

BACKGROUND

As is well known by those skilled in the art, a continuing goal in manufacturing and production of memory devices is increased storage in the minimum area or least amount of silicon. This relentless demand for reduction in size has resulted in various new approaches for building memories. Further, although DRAM or volatile type memories are suitable for many uses, the continuous need for refreshing of this type of memory is simply unacceptable for other uses. There are, of course, non-volatile mass storage memories such as magnetic hard drives, but such devices are much too slow for high-speed computer operations. Thus, high-speed non-volatile memories are in greater and greater demand.

For example, flash memory was developed in 1988 and is programmable, erasable and non-volatile. The basic flash memory cell is an NMOS transistor that has been modified with a "floating" gate. The flash memory cell is programmed by applying a high voltage to the transistor gate or the WL (word line). If a "zero" bit is to be programmed, a high voltage is also applied to the drain by way of the BL (bit line). These voltages excite the electrons such that they push through the thin oxide layer and are trapped on the floating gate. Consequently, the gate carries a negative charge. If the negative charge on the floating gate is above a selected threshold level, the bit stored in the cell is defined as a "zero." On the other hand, if a low voltage is applied to the drain or BL, the number of electrons on the floating gate does not exceed the threshold level so that the state remains the same or a "one." Thus, the default state is "one."

The cell programmed with a "zero" may be erased by applying a high voltage to the gate and leaving the drain or bit line open or floating. Thus, the excess electrons that were trapped on the floating gate now move to the "source" of the transistor, which is typically connected to ground so that the floating gate is again neutral.

To "read" the cell, a high voltage is applied to the gate. If the transistor is turned on, its drain output is pulled low on the bit line and is defined as a "one" using negative logic. If the transistor is not on, its drain is high on the bit line, which is defined as "zero." The cell threshold voltage for a typical un-programmed or erased single bit cell is less than about 3.1 volts, while a cell programmed with a "zero" has a threshold voltage greater than 5.0 volts. Thus, the floating gate NMOS transistor provides a high-speed non-volatile memory cell.

As the demand increases for larger and larger non-volatile high-speed memories, the typical answer has been to aggressively decrease the geometry or size of a memory chip and simply pack more and more cells in the same area. However, demand and need is increasing faster than can be accommodated by scaling or decreased geometry. Consequently, there have now been developed flash cells that can provide two data bits per cell and effectively double the amount of storage in an array. Flash memory cells that can store 2 bits do so by using 4 different precise voltages to represent the state of the 2 bits. For example, for a "1", "1" state, the threshold voltage is typically less than 3.0 volts. For a "1", "0" state, the threshold voltage is typically between about 3.5 volts and 3.8 volts, and for a "0", "1" state, the threshold voltage is typically between about 4.3 volts and 4.7 volts. Finally, for a "0", "0" state, the threshold voltage is above about 5.5 volts.

Of course, the manufacturing process for cells having floating gates that can be charged to these precise voltage settings becomes critical. Furthermore, the circuitry for providing the necessary word line, bit line and gate voltages to achieve the necessary threshold electron charges and resulting voltages is also significantly more complicated.

Another recent development that can store 2 data bits in a single memory cell uses an ONO structure. This memory cell is a transistor with an ONO dielectric programmed by channel hot electrons pumped to the "N" or silicon nitride layer of the ONO structure, which acts as the floating gate. The electron charge is trapped in the silicon nitride layer of the drain junction edge of the ONO stack when the charge is pumped to the edge of the silicon nitride gate. Since charge can be pumped and removed at both edges of the silicon nitride gate, each edge can store a data bit that can be programmed and erased. A "read" operation is carried out in a direction opposite to the direction the bit was programmed, and an erase operation occurs as a result of tunnel enhanced hot "holes" injections created by band-to-band tunneling at the drain junction edge and acceleration occurring from the lateral field.

This type ONO memory array consists of bit lines and word lines that are orthogonal to each other and consequently are presently the densest of known flash memories and at present appear to have a greater future potential than other memory types. Unfortunately, the prior art structures now available are often unreliable in the write and erase operations, because of the difficulty of properly locating the erasing charge over the charged site. Therefore, an ONO or other multilayered type dual bit memory cell that demonstrates reliable write and erase operations would be advantageous.

SUMMARY OF THE INVENTION

These and other problems are generally solved or circumvented, and technical advantages are generally achieved, by preferred embodiments of the present invention which discloses a dual bit multilayered memory cell structure (such as ONO) with a reliable write and erase operation and a method of manufacturing such a structure.

The memory cell comprises a substrate defining at least one channel between a pair of buried diffusion areas that may serve as a source and drain. A first or bottom dielectric layer, such as silicon oxide, is formed over the channel region and a data storage layer is formed over the first dielectric layer. The data storage layer comprises a middle dielectric portion, such as for example silicon nitride formed over a center portion of the first or bottom dielectric layer having a first edge and a second edge. First and second floating gates, such as poly silicon portions are located proximate the first and second edges, respectively, of the middle or nitride dielectric. A top or second dielectric layer, such as silicon oxide, is formed over the data storage layer and a gate electrode, such as a poly gate and spacers are then formed to complete the memory cell structure. The first and second floating gates are adjacent the two edges of the middle dielectric or silicon nitride and define the locations of the charged storage at the edge of the middle layer (e.g., silicon nitride), such that the write and erase operations are consistent and repeatable.

An etching step that is highly selective to the top and bottom dielectric layers is used to etch away portions of the middle dielectric layer thereby "pulling back" the middle layer to leave pockets between the top and bottom dielectric layers at the edge of the middle layer. The first and second floating gates, such as for example, poly silicon portions discussed above are formed in these pockets. According to one embodiment, a first poly silicon deposition step is used to fill these pockets to form two poly floating gates at each edge of a nitride dielectric layer. A second poly silicon deposition is then etched to form the transistor gate over the top of the second oxide dielectric. Spacers are then formed at the edge of the gate in a manner well known to those skilled in the art.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
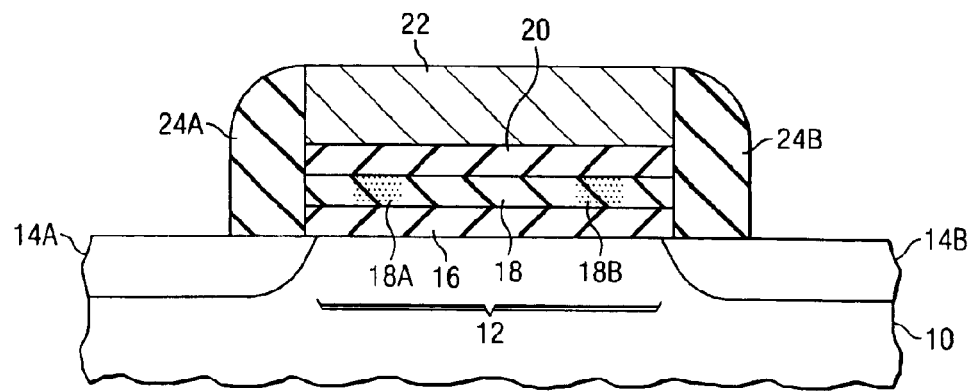
FIG. 1 is a simplified illustration of a prior art ONO dual bit memory cell structure wherein the nitride dielectric "N" of an ONO structure acts as a floating gate.

Referring now to FIG. 1, there is shown a simplified illustration of a prior art NROM dual bit "ONO" memory cell having a nitride dielectric floating gate "N" sandwiched between two oxide dielectric layers. As shown, a silicon substrate 10 defines a channel region 12 separating buried diffusion areas or source and drain areas 14a and 14b. An "O" or oxide dielectric layer 16, such as silicon oxide, is deposited above the channel region 12. An "N" or nitride type dielectric layer 18, such as silicon nitride, is deposited over the oxide dielectric layer 16. As will be discussed, the nitride dielectric layer 18 operates as a floating gate to trap electrons when the cell is programmed. A second "O" or oxide dielectric layer 20 is then deposited over the nitride layer 18. A poly gate layer 22 and spacers 24a and 24b are then formed to complete the basic structure. As will be appreciated by those skilled in the art, the NROM cell structure allows the storage of two data bits because the two undefined edge areas 18a and 18b of the nitride dielectric layer 18, and more clearly shown in FIG. 1, can each received isolated pumped electrical charges.

Figure 2A:
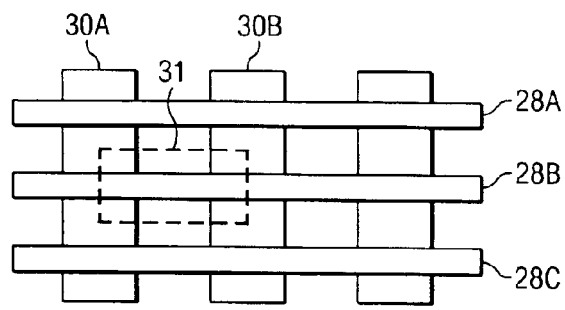
FIG. 2A is a layout view of ONO dual bit memory cells.
Figure 2B:
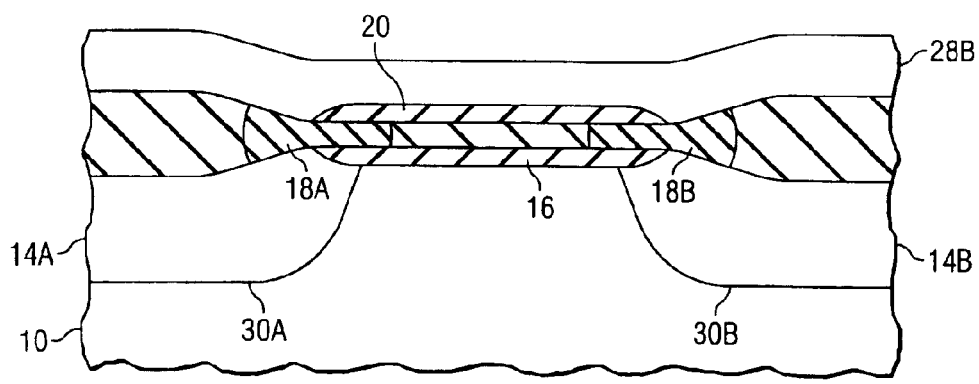
FIG. 2B is a more realistic illustration of the ONO dual bit memory structure showing the bit line and the areas where a charge may be deposited at each of the "N" layer.

FIG. 2A illustrates a typical layout of an NROM (ONO) dual bit memory cell structure. Those portions of the structure of FIG. 2A that are equivalent to the simplified structure of FIG. 1 carry the same reference numbers, and show the straightforward orthogonal arrangement of the WL's (word lines) 28a, 28b and 28c and the BL's (bit lines) 30a and 30b. The dotted line area 31 shows the outline of a cross-sectional more realistic structural view of the prior art NROM dual bit memory of FIG. 1 and as shown in FIG. 2B. Those elements of FIG. 2B that are equivalent to elements in FIG. 1 carry the same reference numbers.

Figure 3:
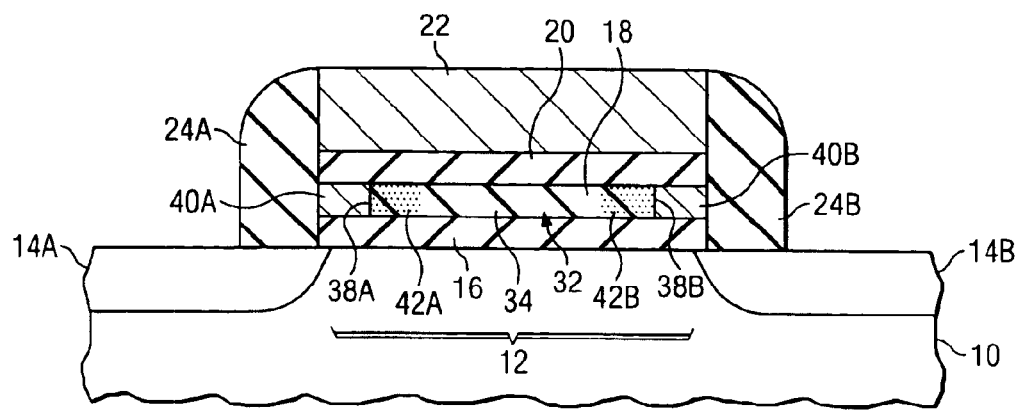
FIG. 3 is a dual bit multilayer memory cell structure with dual floating gates located at each edge of a middle layer to define charge locations for the two storage bits according to the present invention.

Referring now to FIG. 3, there is a simplified illustration of the dual bit ROM structure of the present invention. Those portions of FIG. 3 that are equivalent to portions of FIG. 1, also carry the same reference numbers. Therefore, as shown, the structure is similar to the structure of FIG. 1, except for the storage layer containing a middle dielectric material such as silicon nitride. Therefore, as shown, a data storage layer 32 comprised of a middle dielectric layer 34 (e.g., silicon nitride) is formed over an intermediate or central portion of a first or bottom dielectric layer 16, such as for example silicon oxide. At this point, the structure is typically subjected to an oxidation process that converts the surfaces at the edges of the middle dielectric layer 34 to oxide portions 38a and 38b, such as silicon oxide portions. A pair of floating gates 40a and 40b (e.g., poly silicon) make up the rest of the data storage layer 32. FIG. 3 also illustrates how poly gates 40a and 40b define the areas 42a and 42b where the electrons collect that will represent the dual data bits. A top or second dielectric layer 20, a structure gate 22, such as poly silicon gates and spacers 24a and 24b are then formed to complete the dual bit memory cell structure of FIG. 3 according to the present invention.

Figure 4:
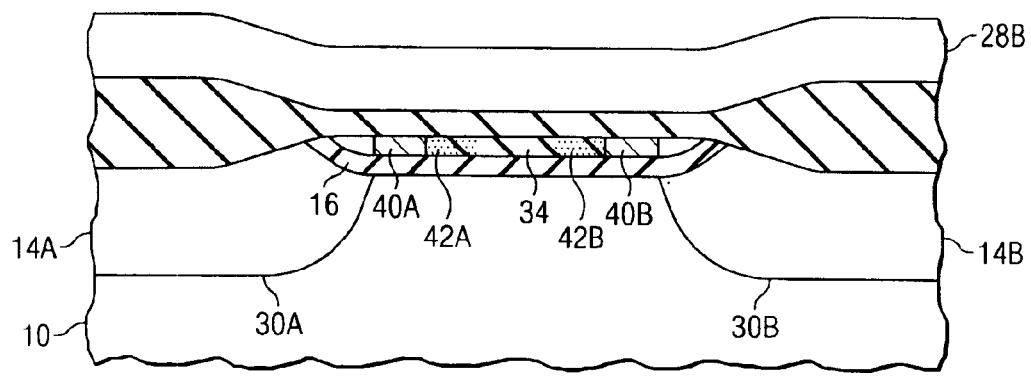
FIG. 4 is a graphic illustration of the multilayered dual bit memory structure with defined charged locations according to the present invention.

A layout of circuits of the type shown in FIG. 4 will have the orthogonal arrangement of the WL's (word lines) and BL's (bit lines) similar to that shown in FIG. 2A. FIG. 4 also illustrates the location of the small floating gates 40a and 40b that define the locations 42a and 42b where the electron charges will be stored. Thus, it is seen that the operation of the structure of the present invention as shown in FIGS. 3 and 4 is similar to that of the memory cell devices of FIGS. 1, 2A and 2B except that that placement of the dual gates 40a and 40b precisely define the locations of the pumped electrons of the two data bits. This precise location of the pumped electrons results in improved reliability for the write/erase operations.

Figure 5A:
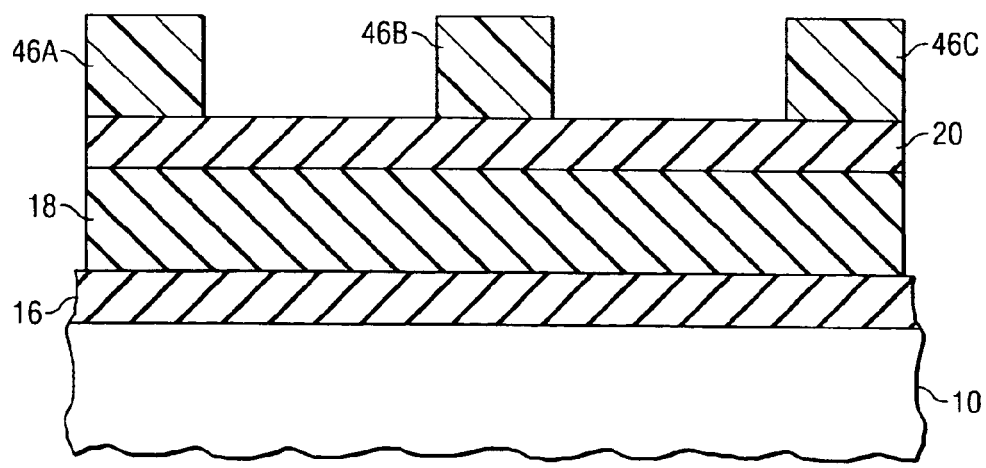
FIGS. 5A–5G illustrate the process steps for forming the structure of the present invention.
Figure 5B:
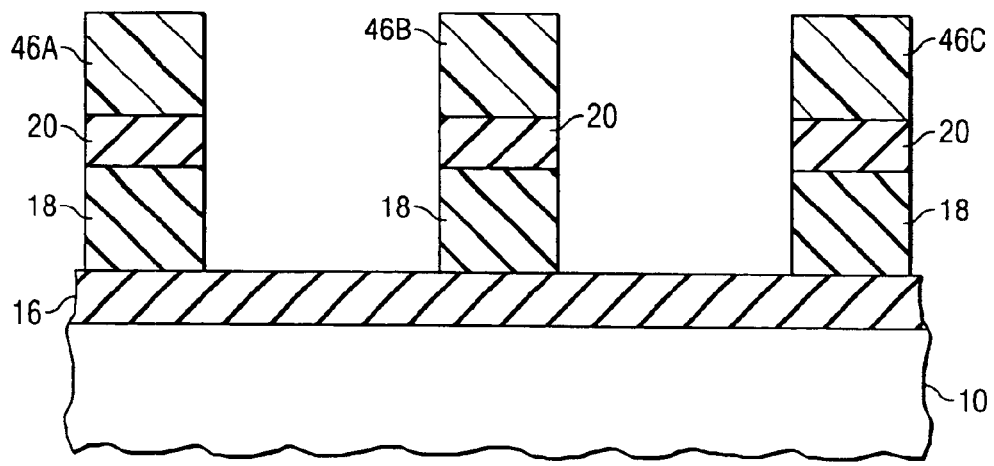
Figure 5C:
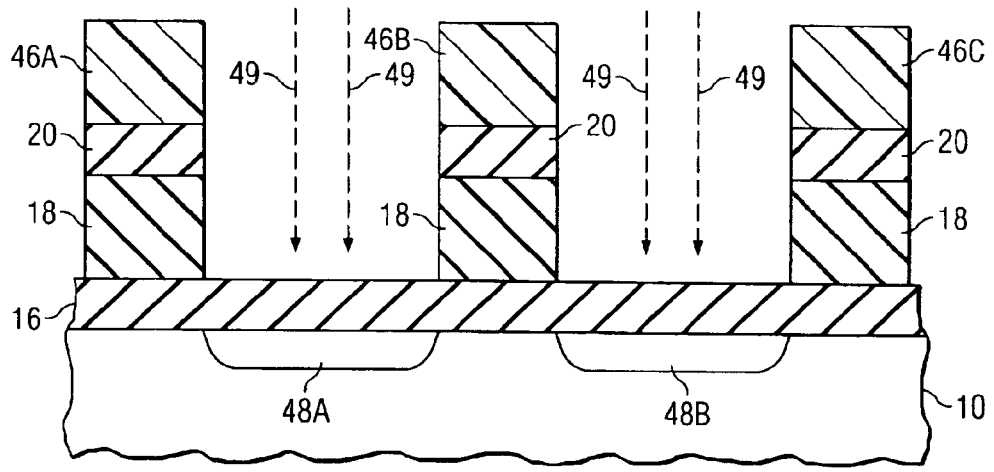
Figure 5D:
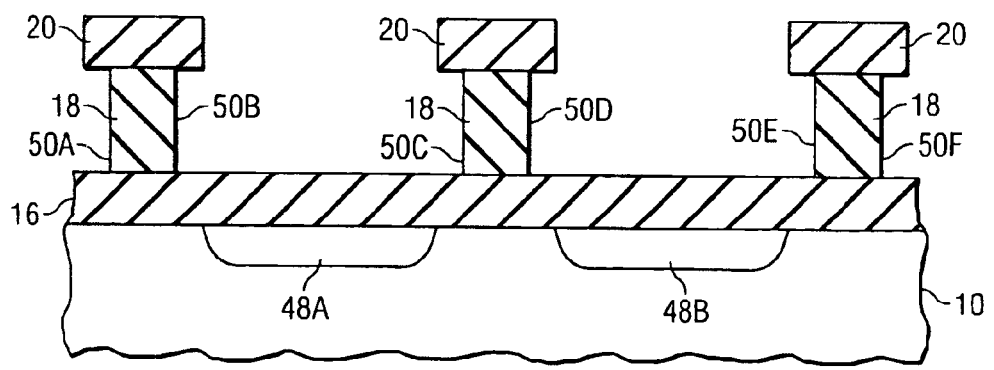
Figure 5E:
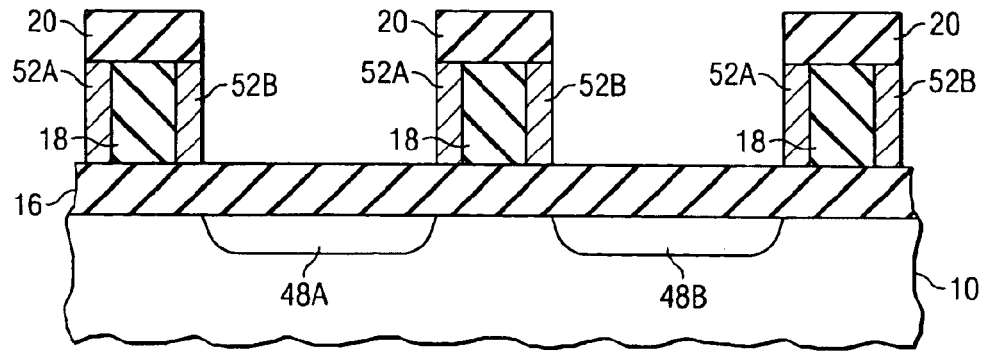
Figure 5F:
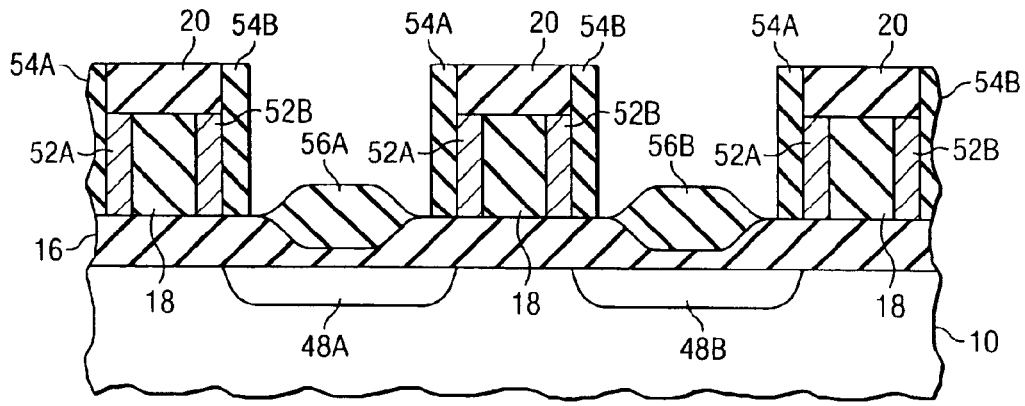

Referring now to FIGS. 5A–5G, there is illustrated the process flow for manufacturing the dual bit memory cell of the present invention. The process figures use reference numbers that represent the same elements discussed above with respect to FIGS. 1, 2A, 2B, 3 and 4. Therefore, as shown in FIG. 5A, there is a substrate 10 made of a material such as silicon covered by a first or bottom dielectric layer 16, such as silicon oxide. A middle dielectric layer 18, such as silicon nitride is then deposited over the bottom or first dielectric 16 followed by a deposition of a top or second dielectric layer 20, such as silicon oxide, as shown. According to one embodiment, the layered structure is then covered by a layer of photoresist that is patterned by photolithography to form the photoresist mask indicated by photoresist portions 46a, 46b and 46c. The structure is then subjected to an etch process that removes the top or second layer of dielectric 20 and the middle dielectric 18 and stops at the bottom or first layer of dielectric 16 to produce the structure illustrated in FIG. 5B. Buried diffusion or source/drain regions 48a and 48b connected to bit lines may then be formed by ion implantation as illustrated by arrow 49 in FIG. 5G. After the ion implantation step, the photoresist portions 46a, 46b and 46c are removed and the structure is exposed to an RTP (rapid thermal process). The RTP is followed by an etching process, such as wet etching, that readily etches the middle dielectric layer 18 (e.g., silicon nitride) but is highly selected to the bottom and top or first and second dielectric layers so as to "pull back" the middle layer to form the pocket structure shown in FIG. 5D. The "pull back" areas or pockets 50a–50f between the top and bottom dielectric layers 16 and 20 are then, according to an embodiment of the invention, subjected to an ISSG (in situ steam generation) process to convert the exposed surface of the middle or nitride dielectric layer 18 to form a silicon oxide film. A first layer of poly silicon is then deposited and isotropically etched to produce or form a pair of floating poly side gates 52a and 52b as shown in FIG. 5E. The etched structure with the floating gates 52a and 52b is then subjected to an oxidation process to form an oxide film 54a and 54b on the sidewalls of the gate structure 54 and the isolation oxide indicated at 56a and 56b in FIG. 5F.

Figure 5G:
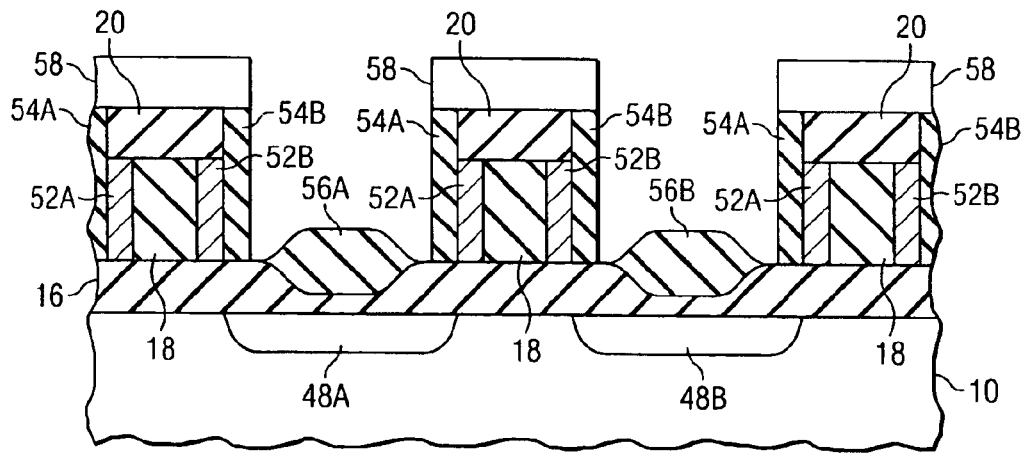

A second layer 58 of poly silicon is then deposited over the structure to form the structure in FIG. 5G.

The second poly silicon layer 58 is then patterned and etched in a manner well known to those skilled in the art to form the poly silicon gate 22 shown in FIG. 3. The structure is then completed by forming sidewall spacers 24a and 24b and the deposition and etching of conductive material to form the word lines 28a, 28b and 28c as shown in FIG. 4.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device for storing electrons representing dual data bits with improved write/erase characteristics comprising:
   a substrate defining at least one channel region having a selected width and separating areas of buried diffusion;
   a bottom dielectric formed over said channel region and having a first edge and a second edge;
   a data storage layer formed over said bottom dielectric, said data storage layer comprising a middle dielectric extending between first and second end surfaces, and covering an intermediate portion of said bottom dielectric, said middle dielectric collecting and storing said electrons therein adjacent said first and second end surfaces as said dual data bits, a first floating gate extending over said bottom dielectric from said first edge to said first end surface of said middle dielectric and a second floating gate extending over said bottom dielectric from said second edge to said middle dielectric;
   a top dielectric covering said data storage layer; and
   a gate electrode formed over said top dielectric.

2. The semiconductor device of claim 1 further comprising spacers formed at the edges of said bottom dielectric, said data storage layer, said top dielectric and said gate electrode.

3. The semiconductor device of claim 1 wherein said bottom dielectric is silicon oxide.

4. The semiconductor device of claim 3 wherein said top dielectric is silicon oxide.

5. The semiconductor device of claim 3 wherein said middle dielectric is silicon nitride.

6. The semiconductor device of claim 4 wherein said middle dielectric is silicon nitride.

7. The semiconductor device of claim 3 wherein said bottom dielectric has a thickness of between about 70 and about 100 Å.

8. The semiconductor device claim 4 wherein said top dielectric has a thickness of between about 70 and about 100 Å.

9. The semiconductor device of claim 5 wherein said middle dielectric has thickness of between about 50 and about 70 Å.

10. The semiconductor device of claim 1 wherein said gate electrode is a layer of poly silicon.

11. The semiconductor device of claim 1 wherein said first floating gate is made of poly silicon.

12. The semiconductor device of claim 1 wherein said second floating gate is made of poly silicon.

13. The semiconductor device of claim 1 wherein said first and second floating gates are made of poly silicon.

14. An ONO semiconductor device for storing electrons representing dual data bits with improved write/erase characteristics comprising:
   a substrate defining at least one channel region having a selected width and separating areas of buried diffusion;
   a first oxide dielectric formed over said channel region and having a first edge and a second edge;
   a data storage layer formed over said first oxide dielectric layer, said data storage layer comprising a nitride dielectric layer extending between first an second end surfaces and covering an intermediate portion of said first oxide dielectric layer, said nitride dielectric layer collecting and storing said electrons therein adjacent to said first and second end surfaces as said dual data bits, a first poly silicon floating gate extending over said oxide dielectric layer from said first edge to said first end surface of said nitride dielectric and a second poly silicon floating gate extending over said oxide dielectric layer from said second edge to said second end surface of said nitride dielectric;

a second oxide dielectric layer covering said data storage layer; and a poly silicon layer formed over said second oxide dielectric layer.

15. The semiconductor device of claim 14 further comprising spacers formed at the edges of said first oxide layer, said data storage layer, said second oxide dielectric layer and said poly silicon layer.

16. The semiconductor device of claim 14 wherein said first oxide layer is silicon oxide.

17. The semiconductor device of claim 16 wherein said second oxide layer is silicon oxide.

18. The semiconductor device of claim 16 wherein said nitride dielectric layer is silicon nitride.

19. The semiconductor device of claim 17 wherein said nitride dielectric layer is silicon nitride.

20. The semiconductor device of claim 16 wherein said first oxide layer has a thickness of between about 70 and about 100 Å.

21. The semiconductor device of claim 17 wherein said second oxide layer has a thickness of between about 70 and about 100 Å.

22. The semiconductor device of claim 18 wherein said nitride dielectric layer has thickness of between about 50 and about 70 Å.

23. The semiconductor device of claim 1 further comprising an oxide portion formed on said first and second end surfaces.

24. The ONO semiconductor device of claim 14 further comprising an oxide portion formed on said first and second end surfaces.

* * * * *

UNITED STATES PATENT AND TRADEMARK OFFICE
CERTIFICATE OF CORRECTION

PATENT NO. : 6,956,254 B2
DATED : October 18, 2005
INVENTOR(S) : Yang et al.

It is certified that error appears in the above-identified patent and that said Letters Patent is hereby corrected as shown below:

<u>Title page,</u>
Item [75], Inventors, "Min Ca" should be -- Min Cao --.

<u>Column 6,</u>
Line 62, delete "an" and insert -- and --.

Signed and Sealed this

Eighteenth Day of April, 2006

JON W. DUDAS
*Director of the United States Patent and Trademark Office*